United States Patent [19]

Virupaksha et al.

[11] Patent Number: 4,500,842
[45] Date of Patent: Feb. 19, 1985

[54] ADAPTIVE GAIN VARIABLE BIT RATE NIC PROCESSOR

[75] Inventors: Krishnamoorthy Virupaksha, Brookeville; Henri G. Suyderhoud, Potomac, both of Md.

[73] Assignee: Communications Satellite Corporation, Washington, D.C.

[21] Appl. No.: 363,699

[22] Filed: Mar. 30, 1982

[51] Int. Cl.³ .................. H03K 17/00; H03K 5/00; G06G 7/14

[52] U.S. Cl. ................. 328/150; 328/151; 328/147; 328/135

[58] Field of Search .......... 328/150, 151, 147, 135; 330/134, 136, 141, 278, 280, 281, 129; 333/14

[56] References Cited

U.S. PATENT DOCUMENTS

| 3,588,534 | 6/1971 | Campbell | 307/351 |
| 3,789,143 | 1/1974 | Blackmer | 333/14 |
| 3,931,584 | 1/1976 | Motley et al. | 330/129 |
| 3,969,683 | 7/1976 | Fabricius | 330/129 |
| 4,027,281 | 5/1977 | Greve et al. | 330/278 |
| 4,066,977 | 1/1978 | Chambers et al. | 330/129 |
| 4,075,573 | 2/1978 | Kennedy et al. | 330/129 |
| 4,220,929 | 9/1980 | Talbot et al. | 330/281 |
| 4,376,916 | 5/1983 | Glaberson | 330/136 |
| 4,398,157 | 8/1983 | Dieterich | 333/14 |
| 4,399,416 | 8/1983 | Gillespie | 330/136 |

Primary Examiner—John S. Heyman
Assistant Examiner—Timothy P. Gallahan
Attorney, Agent, or Firm—Sughrue, Mion, Zinn, Macpeak and Seas

[57] ABSTRACT

An adaptive gain control is provided at the input of a Variable Rate Nearly Instantaneous Companding (VRNIC) processor to adjust the gain of low level speech signals so that the transmission bit rate and SNR will remain substantially the same for low signal levels as for high signal levels.

9 Claims, 1 Drawing Figure

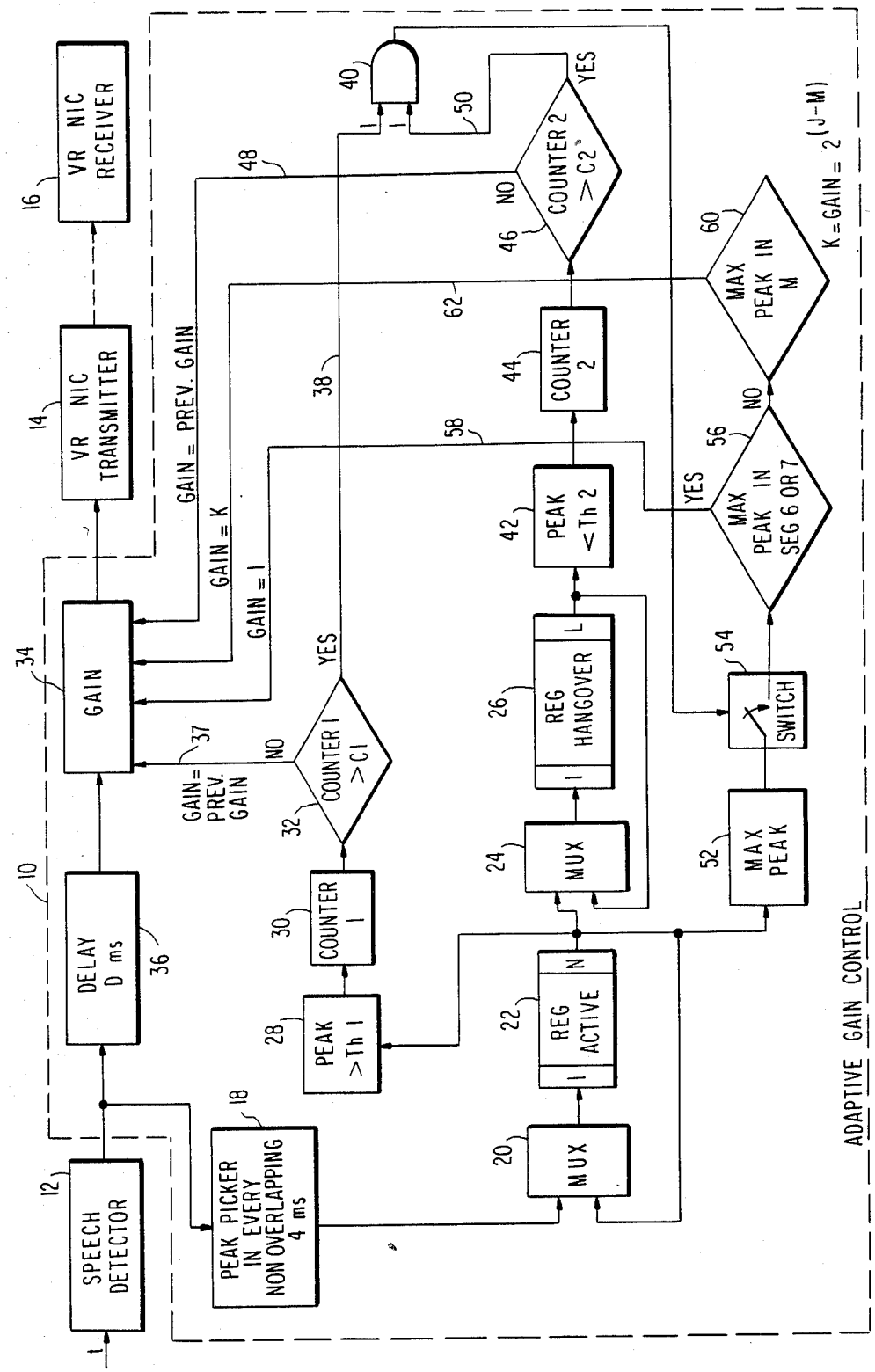

ADAPTIVE GAIN VARIABLE BIT RATE NIC PROCESSOR

BACKGROUND OF THE INVENTION

The present invention relates to the transmission of digital speech signals at reduced bit rates, and more particularly is related to a technique known as "nearly instantaneous companding" (NIC).

Still more particularly, the present invention relates to a gain control device which may be provided at the input to such a NIC processor.

In a conventional NIC processor, speech amplitude samples are companded according to the well known A-law or μ-law algorithms, and the digitally companded samples are then provided to a sample memory. A quantizer receives the samples from the memory and quantizes these samples, and the quantized samples are then encoded for transmission. A maximum sample finder determines the maximum value of N digitally companded speech samples within the memory, and provides a control signal to the quantizer to control the quantizing step size in accordance with the maximum sample value. By varying the step size with a fixed number of quantization levels, the quantizer can cover a wide range of signal amplitude values with a smaller transmission bit rate requirement. The encoder also receives the output from the maximum sample finder so that this information can be transmitted together with the quantized speech signals for use at the receiver in decoding.

A problem with such a conventional NIC processor is that it always utilizes the same number of quantization levels regardless of the maximum sample value, and therefore must vary its quantization range by varying the step size. At large speech amplitudes, the step size increases and this results in an increase in the quantizing noise. To overcome this problem, the present inventors have developed an improved NIC processor which varies the number of quantizing levels as a function of the maximum sample value $S_{max}$. This improved NIC processor is described in copending and commonly assigned application Ser. No. 218,976 entitled "Nearly Instantaneous Companding Processor Using Variable Precission Block Quantization", the entire disclosure of which is incorporated herein by reference. The improved NIC processor described in application Ser. No. 218,976 is advantageous in that not only the quantization step size but also the number of quantization steps are varied for each block of samples in accordance with the value $S_{max}$ to thereby improve the overall signal-to-noise (SNR) ratio. However, the improved processor still suffers from the disadvantage that it yields a higher SNR for high levels of speech, e.g. levels above approximately −15 dBmO, than that achieved for lower level signals. Further, as the speech signal amplitude decreases, the number of quantizing steps will decrease to thereby result in a drop in the average transmission bit rate. It would be desirable to maintain a constant average bit rate of approximately 32 kbit/s, but the actual transmission rate may vary as much as 25 percent from this due to variations in signal amplitude.

SUMMARY OF THE INVENTION

It is an object of this invention to provide a variable bit rate NIC processor which will achieve an almost constant signal-to-quantizing noise ratio (SNR) over a wider dynamic range than previously possible.

It is a further object of this invention to provide such a NIC processor which will maintain a substantially constant average transmission bit rate.

Briefly, these and other objects are achieved according to the present invention by the provision of a novel adaptive gain control device, and the addition of such a gain control device prior to the input of a conventional NIC processor. The gain control circuit increases the amplitude of normally low level signals to a level at which the average transmission bit rate will be an approximately constant 32 kbit/s, and the signal-to-noise ratio (SNR) for the originally low level speech samples is improved. The gain information from the automatic gain control unit which will be necessary to decode the signal can be transmitted to the receiving end by a small number of bits which need not be transmission-error protected.

The adaptive gain control unit in the preferred embodiment comprises a pair of recirculating shift registers which store the peak sample values occurring during adjacent time periods. The contents of each shift register are continually recirculated and examined to determine how many of the samples in the first shift register exceed a predetermined threshold and how many of the samples in the second shift register fall below a second threshold level. At the proper count values indicating the onset of a signal burst, a gain adjustment output signal is provided in response to which the gain control unit determines the value of the maximum sample presently in the first shift register and adjusts the gain in accordance with this maximum value. At all other times, the gain is left unchanged at its previous value.

BRIEF DESCRIPTION OF THE DRAWING

The invention will be more clearly understood from the following description in conjunction with the accompanying drawing, the single FIGURE of which is a block diagram of an adaptive gain variable bit rate NIC processor according to the present invention.

DETAILED DESCRIPTION OF THE PREFERRED EMBODIMENT

The Adaptive Gain Variable Bit Rate NIC (AGVR-NIC) according to the present invention will now be explained with reference to the drawing. Since the variable bit rate NIC processor has far greater application in DSI (Digital Speech Interpolation) systems than in a single channel, it will be assumed that a speech detector is an integral part of the AGVRNIC. It should be realized, however, that the system itself is capable of operation in a single channel application even if the speech detector is not used. When the processor is used with a speech detector, the only characteristic of the speech detector that is of importance is the hangover time, i.e. the length of the register 26 in the drawing. If the speech detector has a hangover time of, e.g., 128 ms, the AGVRNIC should operate with a hangover time at least as long or a false burst may occasionally be detected.

Referring now to FIG. 1, the processor according to the present invention essentially comprises an Adaptive Gain Control (AGC) 10 which receives the speech samples from a speech detector 12. The AGC unit then performs a gain control algorithm on the received speech samples, and provides the gain-adjusted samples to the input of a Variable Rate NIC transmitter 14. The transmitter then encodes the speech samples, transmits them to a receiver 16, and the receiver 16 then decodes the received signal and provides the original speech amplitude samples. The transmitter 14 and receiver 16 may be the same as illustrated in FIG. 2 of said application Ser. No. 218,976, with the transmitter 14 including a variable bit rate NIC processor which varies both the quantizing step size and the number of quantizing levels in accordance with the detected maximum sample value. The novelty of the present invention does not reside in the transmitter 14 and, therefore, said U.S. application Ser. No. 218,976 may be consulted for a more complete understanding of the operation of the transmitter 14. For a proper understanding of the invention, it need only be remembered that the quantization scheme is determined in accordance with the maximum sample value in a block of N samples. For the purposes of the following description, it will be assumed that the NIC block length is 32 (=4 ms for an 8 kHz sampling rate), but it should be apparent that other sampling rates and block lengths could be used as well.

The internal structure and operation of the adaptive gain control unit 10 will now be described. The speech samples are provided from the speech detector 12 to the input of a peak value detector 18 which selects a single peak valued sample from each non-overlapping 4 ms of the speech detector output. These samples are supplied through a multiplexer 20 to the input of a recirculating shift register 22 labelled REG ACTIVE. The output from the shift register 22 is supplied through a multiplexer 24 to the input of a second shift register 26 labelled REG HANGOVER which is also of the recirculating type. Since the register 26 receives the output from the register 22, the contents of the register 26 will correspond to the speech signal delayed with respect to the speech signal represented by the contents of register 22, and the significance of this feature will become more apparent from the description below.

As described above, the peak detector 18 will provide a single maximum sample value from each 4 ms period, so that the register 22 will receive one new sample every 4 milliseconds. During the time interval between each sample received from the peak detector 18, the register 22 recirculates its contents through a feedback path including the multiplexer 20. During this recirculation, each stored sample value is compared to a threshold Th1 in the comparator 28, and a counter 30 is incremented each time that a sample value exceeds Th1. A step indicated at 32 is the examination of the value in counter 30 to determine if the contents exceed a predetermined value C1. This examination could be performed in a simple manner by a microprocessor if one is to be used in the system, or could just as easily be performed by a simple comparator using a value C1 as its reference level.

In addition to being supplied to the input of the peak detector 18, the output from the speech detector is provided to a gain adjustment device 34. In the embodiment illustrated in the FIGURE, the speech samples are provided to the gain device 34 through a delay 36, but this delay is provided for subjective quality improvements only, and is not necessary for the invention to be operable.

If the value in counter 30 does not exceed the comparison value C1, it can be determined that there are very few speech samples in the register 22, so that the speech signal currently being provided at the output of the speech detector 12 is inactive. In such a case, there is no need to adjust the amplitude of the samples, and a signal is provided on line 36 from the comparator 32 to the gain control circuit 34 to thereby maintain the gain at its previous value. If the value in counter 30 does exceed the comparison value C1, there are a significant number of speech samples in the register 22, and it can be determined that the speech signal from the speech detector 22 is currently active, e.g. a burst is occurring in the signal being received by the speech detector. In such a case, a signal is provided on line 38 from the comparator 32 to an AND gate 40.

During each 4 ms interval between the reception of each peak value sample from the peak detector 18, and simultaneously with the recirculation of the contents of register 22, register 26 recirculates its contents through a feedback path including the multiplexer 24. During the recirculation, each value in register 26 is compared with a second threshold Th2 in a comparator 42, and a second counter 44 is incremented each time that a value in the register 26 fails to exceed Th2. A comparison is performed at 46 in a manner similar to the comparison performed at 32, with a count value exceeding C2 representing a period of little or no speech activity in the register 26, and a count value less than C2 representing a period of substantial speech activity in the register 26. It should be noted once again, however, that the speech signal represented by the samples in the register 26 is delayed with respect to that in the register 22. Thus, a value in excess of C2 in the counter 44 indicates that the signal activity in register 22, whether it be high or low, was preceded by an inactive period, and a low value in the counter 44 indicates that the signal in the register 22 was preceded by an active speech signal. If the value in counter 44 does not exceed C2, a signal is provided on line 48 to the gain control device 34 to maintain its gain at the previous gain value. If the value in counter 44 does exceed C2, a signal is provided on line 50 to the second input of AND gate 40.

The significance of the values in counters 30 and 44 will now be explained. If a burst-type signal is being provided to the speech detector 12, the sample amplitudes will be low during the inactive period or hang-over time between bursts. The sample amplitudes will rise at the beginning of a burst, remain high during the course of the burst and will then decrease to a low level during the subsequent inactive period. The contents of register 22 will reflect these changes in sample amplitude substantially immediately, while the changes in sample amplitudes will be reflected in the register 26 on a delayed basis.

During the middle portion of a burst, the value in counter 30 will be high while the value in counter 44 is low, so that signals will be provided from the comparators 32 and 46 on lines 38 and 48, respectively. The AND gate 40 is not enabled due to the lack of a signal on line 50, and the signal on line 48 causes the gain adjustment device 34 to maintain its previous gain value, i.e. the gain value which was set at the beginning of the burst as will be explained below.

As the speech signal continues, the burst will end and the signal will become substantially inactive. The value in counter 30 will then fall below C1 indicating that the signal is now entering an inactive or hangover period, and a signal on line 36 will cause the gain adjustment device 34 to maintain its previous gain value. During this transition period between active and inactive status at the end of the burst, there will be a brief time during which the contents of register 22 represent an inactive signal while the contents of register 26 are still representing an active signal at the end of the burst. There will thus be signals on both of lines 36 and 48.

Shortly thereafter, the registers 22 and 26 will both contain predominantly inactive signal sample values, and the comparator 46 will provide an output signal on line 50. However, due to the lack of a signal on line 38, the AND gate 40 will remain disabled. As the signal processes, a new burst will begin and this will be indicated by an increase in the number of active sample values in the register 22. The value in counter 30 will exceed C1, and a signal will be provided on line 38. Further, the contents of register 26 are delayed with respect to the contents in register 22, so that the register 26 contents will continue to represent an inactive signal and the comparator 46 will still be providing an enabling signal on line 50. This indicates that the present speech signal is active while the immediately preceding speech signal is inactive, i.e. that a burst has just begun, and the AND gate 40 is then enabled to permit any necessary gain adjustment. The various possible combinations of speech activity and the corresponding response of the adaptive gain control device are set forth in the following Table 1.

TABLE 1

| SPEECH ACTIVITY DECIPHER | | | |
|---|---|---|---|
| Counter 1 | Counter 2 | Speech Activity | Gain |
| >C1 | >C2 | Onset of Speech Burst | $2^{(6-M)}$++ |
| >C1 | <C2 | Middle of Speech Burst | No Change+ |
| <C1 | >C2 | No Speech Activity | No Change+ |
| <C1 | <C2 | End of Speech Burst | No Change+ |

++ If $M > 5$, Gain = 1
+ Gain = previous gain

As described above, the only gain adjustment to be performed will be performed at the onset of a speech burst, and the gain adjustment to be performed will now be described.

During the recirculation of the contents of register 22 and successive comparison of these contents to the threshold Th1, each sample in the register 22 is also provided to the maximum peak detector 52 which determines the value of the maximum sample contained in the register 22 at any given time. When the gate 40 is enabled, the output thereof will close a switch 54, and the switch 54 will be again opened as soon as sufficient active samples are supplied to the register 26 to decrease the value in counter 44. Thus, the gain control will be performed in accordance with the maximum sample value contained within the 4 ms period before the beginning of the burst shows up in the register 26.

The value of this maximum peak from the peak detector 52 is then examined to determine more accurately the amplitude range into which it falls. For example, the sample from peak detector 52 can be subjected to 8 level quantization with the possible amplitude range being separated into segments 0-7. If a comparator 56 determines that the maximum sample amplitude falls within the top two amplitude segments 6 or 7, it is determined that a high level signal is present and that a gain of unity should be used, with an appropriate signal being provided on line 58 to the gain adjustment device 34. On the other hand, if the amplitude of the maximum sample falls within one of the segments M below the sixth or seventh segments, it is determined that a lower level active speech signal is present, and an appropriate gain adjustment is performed. In the illustrated embodiment, the adjusted gain k is determined in accordance with the formula $k = 2^{(6-M)}$, although other gain formulas may be preferable to a particular user. This could be performed in a gain setting component 60 which could be either a quantizer with simple logic circuitry or a microprocessor. For example, one simple arrangement would be to combine the components 56 and 60 into a single quantizer which provides a multiple bit output on lines 58 and 62 representing the amplitude range of the maximum sample from the peak detector 52. The line 58 could carry only the most significant bit of the quantizer output which would indicate whether or not the amplitude fell within the top two segments, and simple logic could be provided in the gain adjustment device 34 to give the signal on line 58 priority over the multiple-bit signal on line 62. This is but one simple example, and a variety of alternative configurations could obviously be employed.

Using Th1=Th2+6 dB, and with Th2 being 42 below clipping (2048 in 12 bit linear), and with N=16, L=32, C1=8, C2=24, computer simulations of the above invention have yielded 25 to 26 dB of signal-to-quantizing noise ratio for speech signals in range of −10 dB m0 to −34 dB m0. Thus, for low level speech signals, a higher SNR ratio has been achieved while maintaining a substantially constant average bit rate of 32 kbit/s.

The parameters which would need optimization for different applications of the invention would be the thresholds Th1, Th2, C1, and C2, the length N of the active shift register 22, the length L of the hangover shift register 26 and the value of J in the formula for the gain k. All of these values could be adjusted in a very straightforward manner with obvious effects on the system performance, and the adjustment could be performed empirically if desired.

With an adaptive gain variable bit rate NIC processor as described above, the added adaptive gain control yields an almost constant signal-to-quantizing noise ratio of about 26 dB over a wider dynamic range than would otherwise be possible. The adaptive gain control of the type described herein could be perferably used in an application where a constant level speech input signal is desired. The advantages achieved by the invention are a reduced rate of transmission without sacrificing quality, the ability to use the system in either a single channel or a DSI environment, the ability to use directly a companded PCM input, the provision of a high SNR over a wide dynamic range, and an adaptive gain control algorithm which is capable of providing a constant volume speech source. It should be appreciated that various modifications could be made to the system disclosed above without departing from the spirit and scope of the invention as defined in the appended claims.

What is claimed is:

1. A signal processing apparatus comprising:
   gain control means for receiving input signals and providing said input signals as gain-adjusted output signals, the gain of said gain control means being adjusted in response to a gain adjustment signal;
   first means for determining the highest value of samples of said input signals during each of several first time periods:
   second means for determining the highest value of samples of said input signals during each of several time periods which precede said first time periods; and control means responsive to output signals from said first and second means for providing said gain adjustment signal to said gain control means in response to the number of said highest values of said input signals within a range of amplitudes as determined by said first and second means.

2. A signal processing apparatus as defined in claim 1, wherein said first means comprises a first storage means for storing a first plurality of samples of said input signals corresponding to said first period of the time and first counting means for counting the number of said first plurality of samples which exceed a first threshold level; and wherein said second means comprises a second storage means for storing a second plurality of samples of said input signals corresponding to said second period of time and second counting means for counting the number of said second plurality of samples which are below a second threshold level.

3. A signal processing apparatus as defined in claim 2, wherein said gain adjustment signal is provided by said control means only when the value in said first counting means exceeds a first count value and the value in said second counting means exceeds a second count value.

4. A signal processing apparatus as defined in either of claims 2 or 3, wherein said gain control means adjusts its gain in accordance with the amplitude of the maximum sample stored in said first storage means at the time said gain adjustment signal is provided, said apparatus further comprising means for determining the maximum sample value stored in said first storage means.

5. A signal processing apparatus as defined in claim 2, wherein said first storage means comprises a first shift register receiving said input signal samples as its input, and said second storage means comprises a second shift register receiving as its input the output of said first shift register.

6. A signal processing apparatus as defined in either of claims 2 or 5, wherein said samples received by said first storage means comprise only the maximum sample of said input signals occurring during each consecutive, non-overlapping 4 ms time period, said apparatus further comprising peak detection means receiving said input signals for providing to said first storage means the peak sample of said input signal occurring during each said 4 ms interval.

7. A signal processing apparatus as defined in claim 2, wherein said control means comprises an AND gate receiving a first input signal from said first monitoring means and a second input signal from said second monitoring means.

8. A signal processing apparatus as defined in any one of claims 1, 2, 5 or 7, further comprising a Variable Rate NIC processor for receiving and processing said gain-adjusted output signals.

9. A signal processing apparatus comprising:
gain control means for receiving input signals and providing said signals as gain-adjusted output signals, the gain of said gain control means being adjusted in response to a gain adjustment signal;
sampling means for determining the highest value of samples of said input signals in each of several time periods; and
control means responsive to output signals from said sampling means for providing said gain adjustment signal to said gain control means in response to the number of said highest values occurring in a range of amplitudes of said highest values.

* * * * *